(12) United States Patent
Anderson et al.

(10) Patent No.: US 7,274,053 B2
(45) Date of Patent: Sep. 25, 2007

(54) FIN DEVICE WITH CAPACITOR INTEGRATED UNDER GATE ELECTRODE

(75) Inventors: Brent A. Anderson, Jericho, VT (US); Andres Bryant, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,357

(22) Filed: Nov. 5, 2004

(65) Prior Publication Data

US 2006/0097329 A1   May 11, 2006

(51) Int. Cl.
*H01L 27/148* (2006.01)
(52) U.S. Cl. ............. 257/250; 257/270; 257/328; 257/331; 257/365; 257/E21.442; 257/E29.275
(58) Field of Classification Search ............... 257/308, 257/722, 250, 328, 270, 331
See application file for complete search history.

(56) References Cited

U.S. PATENT DOCUMENTS

| | | | | |
|---|---|---|---|---|
| 5,391,506 | A * | 2/1995 | Tada et al. | 438/268 |
| 6,720,619 | B1 * | 4/2004 | Chen et al. | 257/347 |
| 2003/0042531 | A1 * | 3/2003 | Lee et al. | 257/315 |
| 2003/0151077 | A1 * | 8/2003 | Mathew et al. | 257/250 |
| 2004/0197975 | A1 * | 10/2004 | Krivokapic et al. | 438/200 |

* cited by examiner

*Primary Examiner*—M. Wilczewski
*Assistant Examiner*—Tsz Chiu
(74) *Attorney, Agent, or Firm*—Gibb & Rahman, LLC; William D. Sabo, Esq.

(57) ABSTRACT

A fin-type field effect transistor (FinFET) has a fin having a center channel portion, end portions comprising source and drain regions, and channel extensions extending from sidewalls of the channel portion of the fin. The structure also includes a gate insulator covering the channel portion and the channel extensions, and a gate conductor on the gate insulator. The channel extensions increase capacitance of the channel portion of the fin.

20 Claims, 11 Drawing Sheets

FIN DEVICE WITH CAPACITOR INTEGRATED UNDER GATE ELECTRODE

BACKGROUND OF THE INVENTION

1. Field of the Invention

This disclosure generally related to fin-type field effect transistors (FinFETs) are more particularly to a FinFET that has a fin having a center channel portion, end portions comprising source and drain regions, and capacitive channel extensions extending from sidewalls of the channel portion of the fin.

2. Description of the Related Art

As transistor design is improved and evolves, the number of different types of transistors continues to increase. For example, one type of transistor that uses a fin-shaped channel region covered with a gate conductor, with the outer portions of the fin being used as source/drain regions is referred to as a fin-type field effect transistor (FinFET). One such FinFET is disclosed in U.S. Pat. No. 6,413,802 to Hu et al. (hereinafter "Hu") and the disclosure of the same is incorporated herein by reference.

Conventional FinFETs can encounter problems because, as the surface areas of the channel regions become smaller and smaller, the circuit node capacitances can become too small. This results in high susceptibility to circuit noise and radiation. The latter leading to extremely high soft error rate. One method of adding capacitance is to increase the surface area occupied by the circuit nodes; however, this is very expensive in terms of circuit area and circuit density.

SUMMARY OF THE INVENTION

Embodiments herein include a method of making a fin-type field effect transistor (FinFET) that forms a semiconductor on an insulator and then patterns the semiconductor into a fin having channel extensions extending from sidewalls of a central channel portion of the fin. The channel portion of the fin and the channel extensions are then covered with a gate insulator. Next a gate conductor is formed on the gate insulator. Then, end portions of the fin are doped to form source and drain regions. The channel extensions increase the capacitance of the channel portion of the fin.

The patterning process forms the channel extensions to be perpendicular to the fin. The process of forming the gate conductor forms a linear conductor that intersects the fin, wherein the channel extensions are patterned to run parallel to the gate conductor. The patterning process also forms the channel extensions and the fin simultaneously as a unitary continuous structure. The channel extensions and the fin are patterned to form a cross-shaped structure. The channel extensions can comprise fins, rectangles, bumps, irregularly shaped structures, etc.

This produces a FinFET that has a fin having a center channel portion, end portions comprising source and drain regions, and channel extensions extending from sidewalls of the channel portion of the fin. The structure also includes a gate insulator covering the channel portion and the channel extensions a gate conductor on the gate insulator. Once again, the channel extensions increase capacitance of the channel portion of the fin.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, as the surface areas of the channel regions become smaller and smaller, the circuit node capacitances can become too small, which can result in high susceptibility to circuit noise and radiation. In order to overcome this problem, the invention adds to the surface area of the channel region to add capacitance (adds a capacitor) to enhance the circuit stability with a minimum impact on density. In essence, the invention adds a capacitor or capacitive element that is part of, or connected to, the channel region beneath the gate electrode of the FinFET device. In a similar manner to the channel region, the capacitance element is insulated from the gate conductor by the gate insulator.

Figure 1:
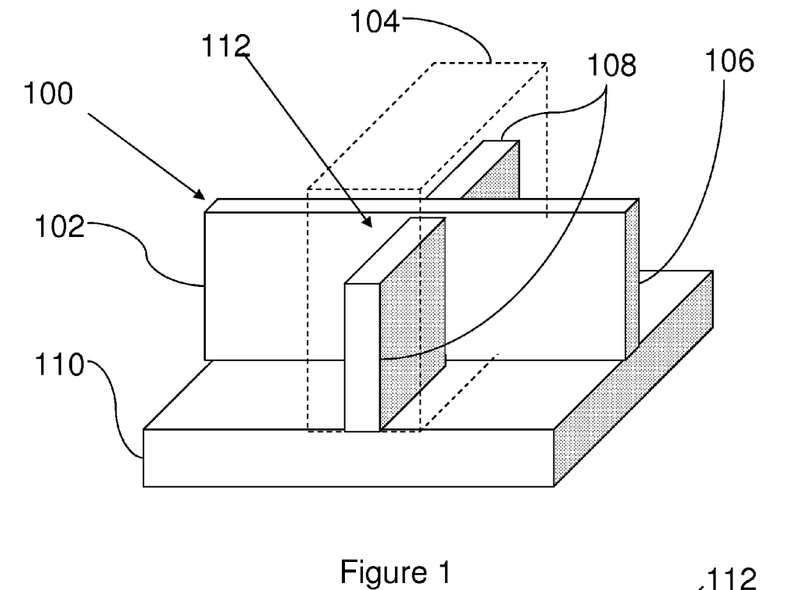
FIG. 1 is a schematic diagram of a perspective view of an embodiment.
Figure 2:
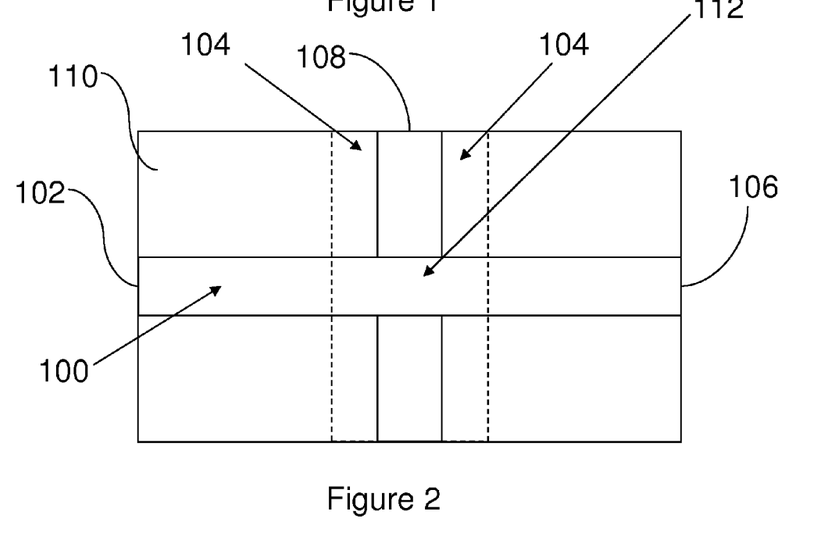
FIG. 2 is a schematic diagram of a top view of the embodiment shown in FIG. 1.

FIG. 1 is a perspective view and FIG. 2 is a top (plan) view of one embodiment. As shown in FIGS. 1 and 2, a FinFET has a fin 100 having a center channel portion 112, end portions comprising source and drain regions 102, 106, and channel extensions 108 extending from sidewalls of the channel portion 112 of the fin 100. The structure also includes a gate insulator covering the channel portion 112 and the channel extensions 108. FIG. 1 also illustrates a gate conductor 104 on the gate insulator. The channel extensions 108 increase capacitance of the channel portion 112 of the fin 100 to overcome the problems of susceptibility to circuit noise and radiation.

The channel extensions 108 can be approximately perpendicular to the fin 100. The process of forming the gate conductor 104 forms a linear conductor that intersects the fin 100, wherein the channel extensions 108 are patterned to run substantially parallel to the gate conductor 108. The patterning process also forms the channel extensions 108 and the fin 100 (channel) simultaneously as a unitary continuous structure. The channel extensions 108 and the fin 100 are patterned to form a cross-shaped structure. The channel extensions 108 can comprise fins, rectangles, bumps, irregularly shaped structures, etc.

Thus, the inventive structure includes channel extensions (protrusions) 108 that are beneath the gate electrode 104. In the invention, capacitance arises from the sidewalls and the top of the body extensions 108. One useful application is to add capacitance to SRAM cell nodes to enhance immunity to noise and radiation.

While FIG. 1 and 2 illustrate symmetric fins 108 extending perpendicular to the direction of the FinFET fin 100, the invention can comprise any number of differently shaped structures (which can be symmetric or asymmetric) that extend from the FinFET fin 100 in order to increase surface area and thereby increase the capacitance of the channel region 112 of the FinFET fin 100. FIG. 3-8 illustrates some of these different embodiments of the invention. However, the invention is not limited to the shapes shown in the drawings, but is applicable to any type of surface protrusion that increases the surface area of the channel region 112 of the FinFET thin at 100.

Figure 3:
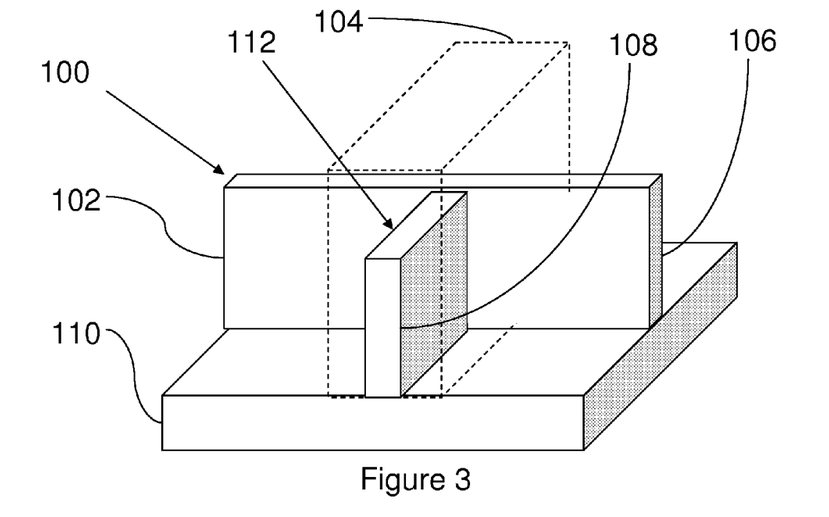
FIG. 3 is a schematic diagram of a perspective view of an embodiment.
Figure 4:
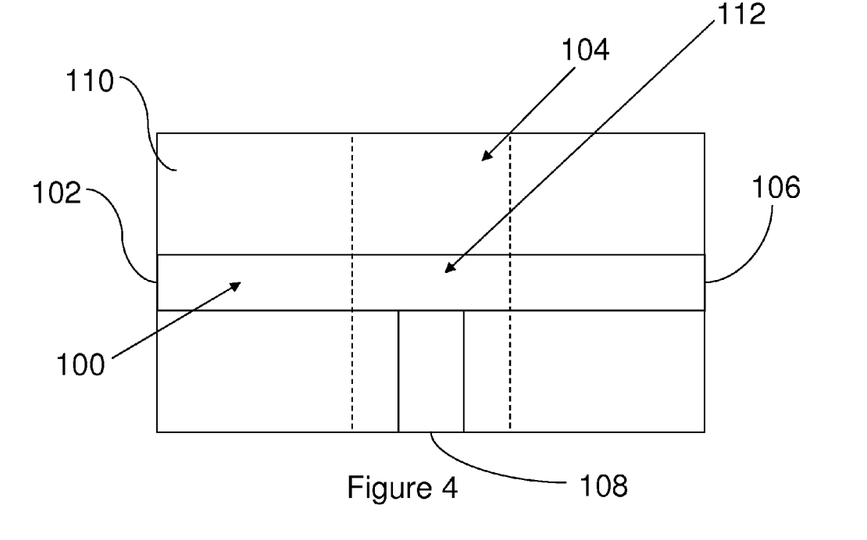
FIG. 4 is a schematic diagram of a top view of the embodiment shown in FIG. 3.
Figure 5:
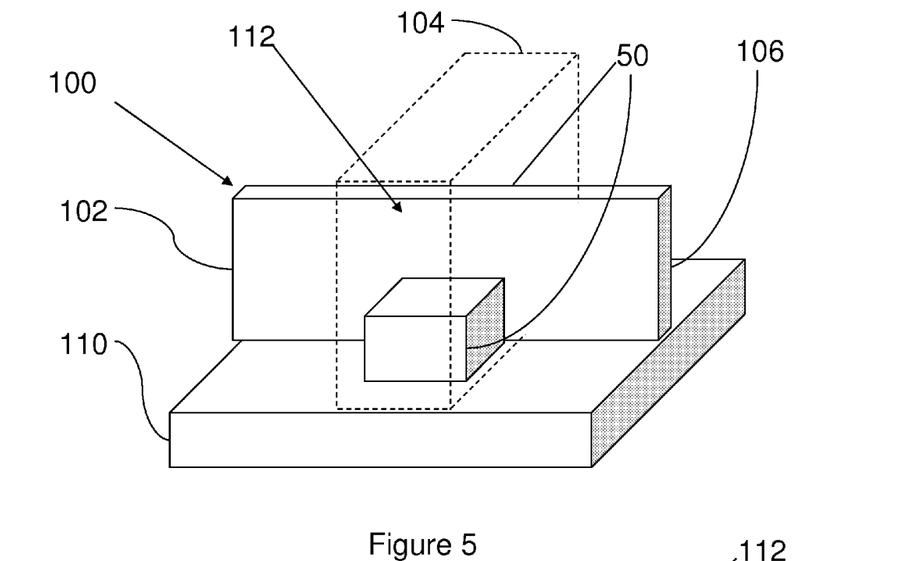
FIG. 5 is a schematic diagram of a perspective view of an embodiment.
Figure 6:
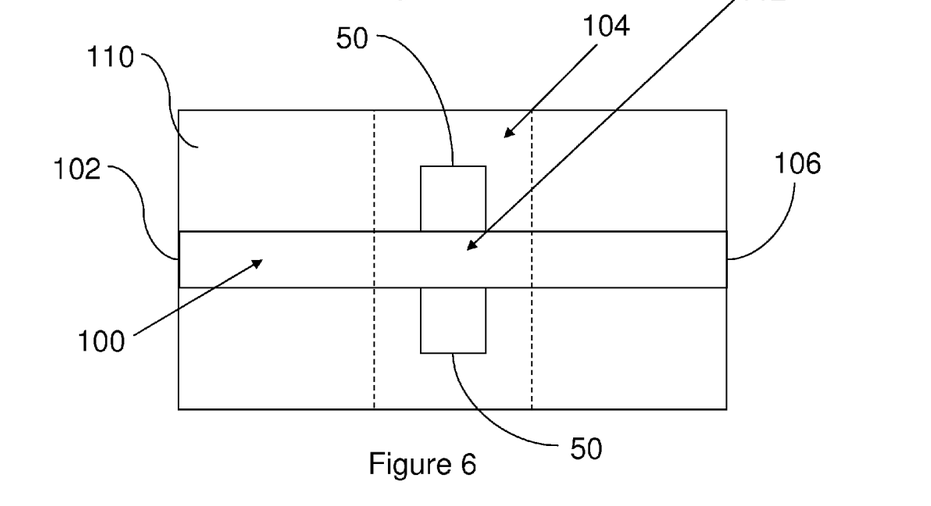
FIG. 6 is a schematic diagram of a top view of the embodiment shown in FIG. 5.
Figure 7:
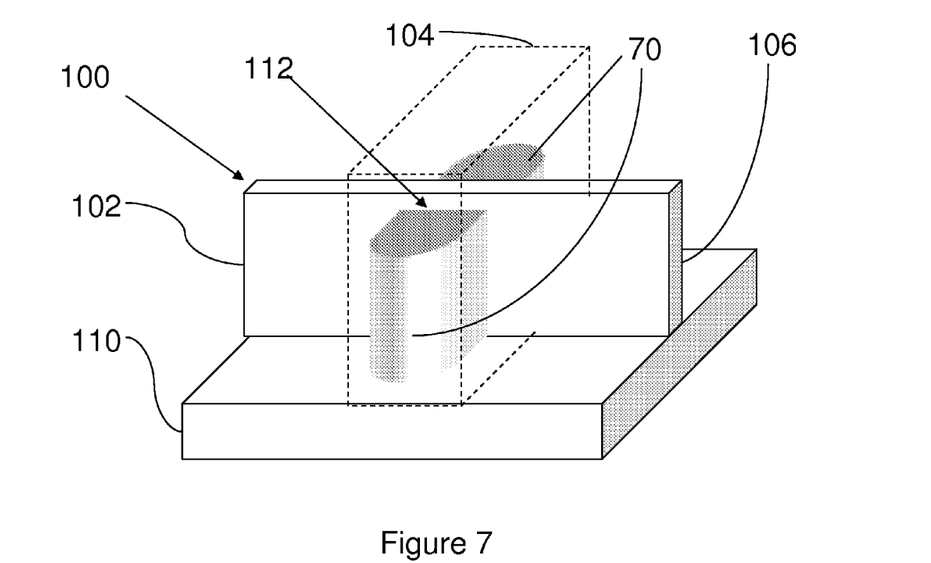
FIG. 7 is a schematic diagram of a perspective view of an embodiment.
Figure 8:
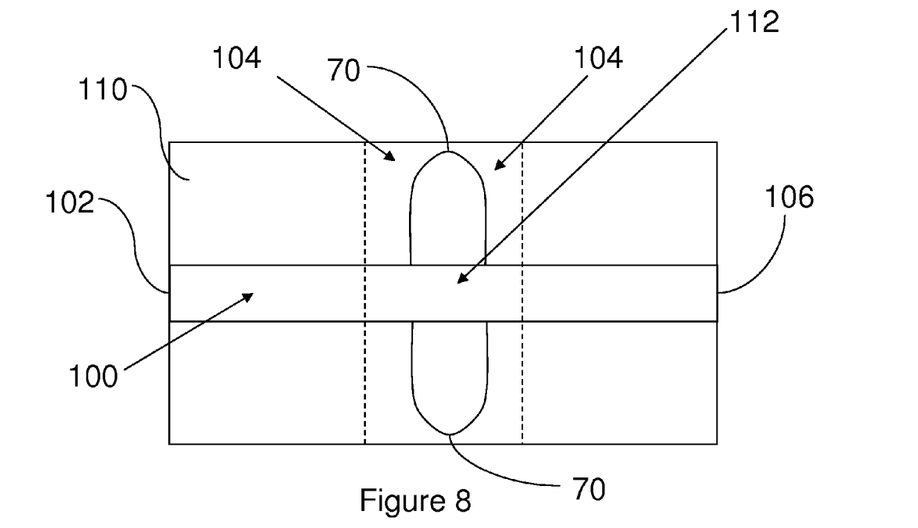
FIG. 8 is a schematic diagram of a top view of the embodiment shown in FIG. 7.

FIGS. 3, 5, and 7 are perspective views and FIGS. 4, 6, and 8 are top (plan) views of the embodiments shown in FIGS. 3, 5, and 7, respectively. FIGS. 3 and 4 illustrate an embodiment that only includes a single channel extension 108 on one side of the fin 100 and therefore comprises an asymmetric structure. FIGS. 5 and 6 illustrate a rectangular (cube or box-shaped) protrusion 50 that can be positioned on one or both sides of the fin 100. FIGS. 7 and 8 illustrate a rounded protrusion 70 that can comprise a bump, cylinder, sphere, or irregularly shaped protrusion. Once again, the protrusion 70 shown in FIGS. 7 and 8 can be positioned on one side or both sides of the fin 100. In addition, the invention can mix and match different shapes on different sides of the same fin to create special capacitance effects or to accommodate space restrictions for adjacent structures such as wiring and other similar design elements associated with the surrounding circuitry.

Figure 9:
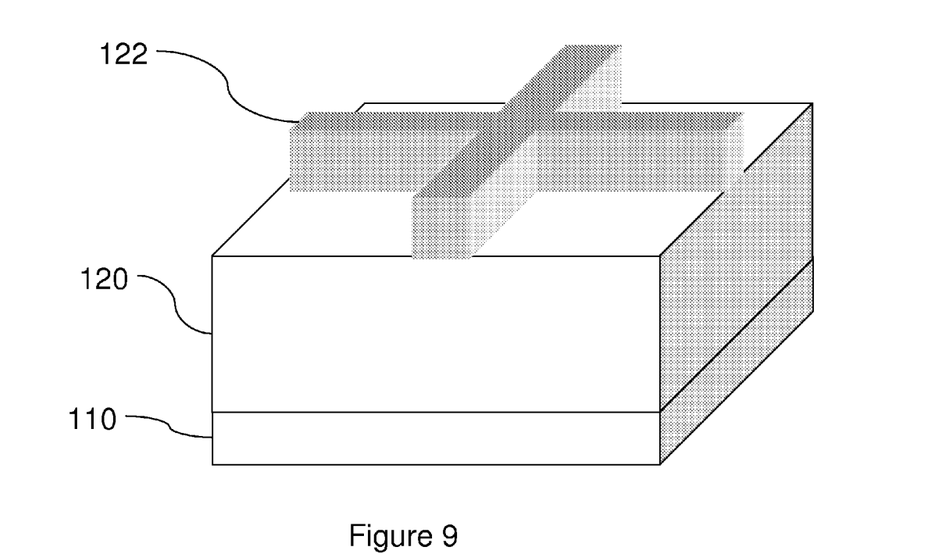
FIG. 9 is a schematic diagram of a partially completed FinFET.
Figure 10:
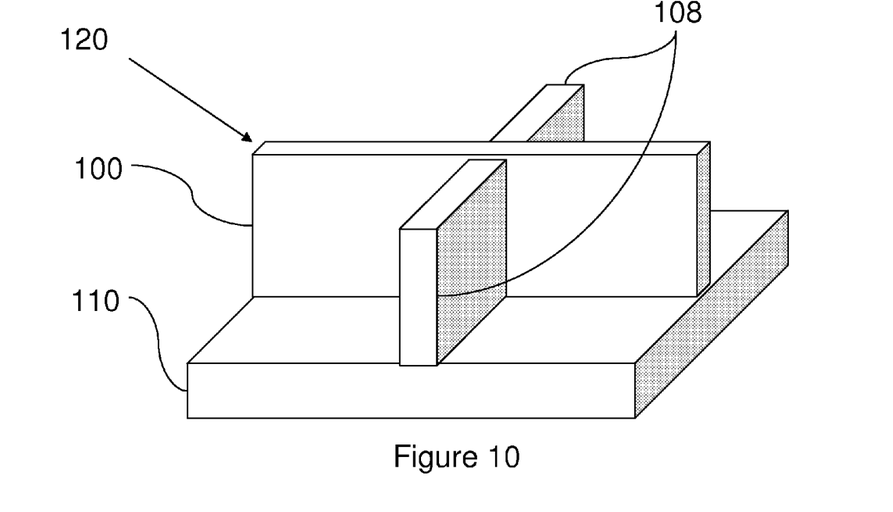
FIG. 10 is a schematic diagram of a partially completed FinFET.

FIGS. 9-19 illustrates some ways in which the inventive structure can be manufactured. The invention is not limited to these specific manufacturing methods and, instead, is applicable to all similar methodologies that can be utilized to form the inventive structure. In FIG. 9, the invention begins with a substrate 110 such as an insulator. A common insulator used for the substrate 110 can comprise an oxide, and layer 110 is sometimes referred to as a buried oxide (BOX) layer. A semiconductor material 120 is deposited or grown over the substrate 110. The semiconductor 120 can comprise any semiconductive material such as doped or undoped silicon or polysilicon, or any insulator that can be selectively temporarily converted into a conductor. A mask 122 is patterned over the semiconductor 120. The mask 122 can comprise any conventional mask, such as a photoresist mask or other similar mask that is easily patterned using conventional technologies. The exposed portions of the semiconductor 120 are then removed using any conventional material removal process, such as etching, etc. and the mask 122 is removed to leave the cross-shaped, t-shaped, or x-shaped structure shown in FIG. 10. In addition, the structure shown in FIG. 10 can be formed using other patterning techniques, such as sidewall image transfer (SIR) and other similar techniques to further reduce the structure's size.

Figure 11:
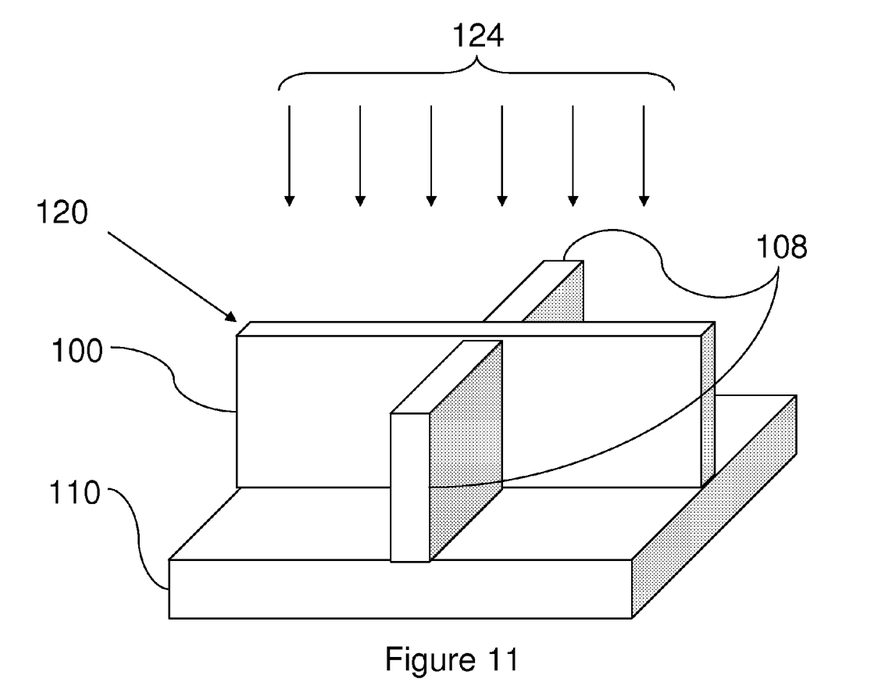
FIG. 11 is a schematic diagram of a partially completed FinFET.

The material 120 formed in FIG. 9, above, can be formed directly as a semiconductor material. Alternatively, the material 120 can comprise and undoped material when formed. In such a situation, FIG. 11 illustrates an initial doping process 124 that can be performed by, for example ion implantation, to convert a pure material (insulator, such as silicon) into doped semiconductor (e.g., doped silicon). This doping process 124 can comprise, for example, implanting arsenic, boron, etc., into silicon in sufficient quantities to make the silicon a semiconductor.

Now that the fin 100 has been doped into a semiconductor, the gate oxide and gate conductor can be formed. The gate oxide and gate conductor can be formed according to a number of different processes. FIGS. 12-15 illustrate one process and FIGS. 16-19 illustrate another process. However, again, the invention is not limited to these specific processes, but is equally applicable to all similar processes, whether currently known or developed in the future.

Figure 12:
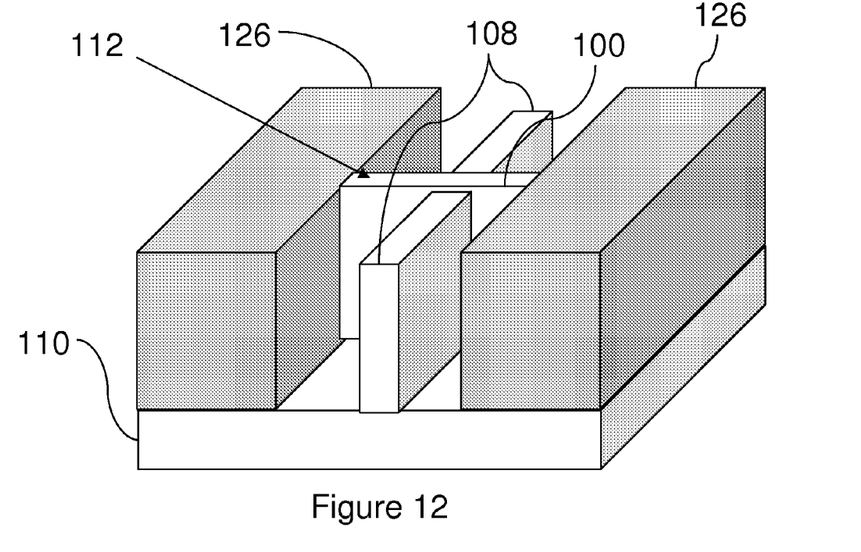
FIG. 12 is a schematic diagram of a partially completed FinFET.
Figure 13:
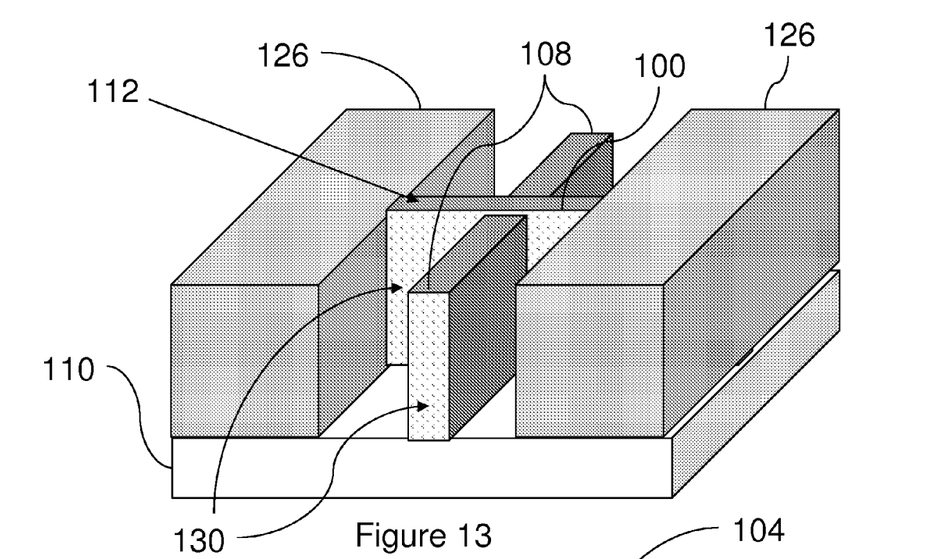
FIG. 13 is a schematic diagram of a partially completed FinFET.
Figure 14:
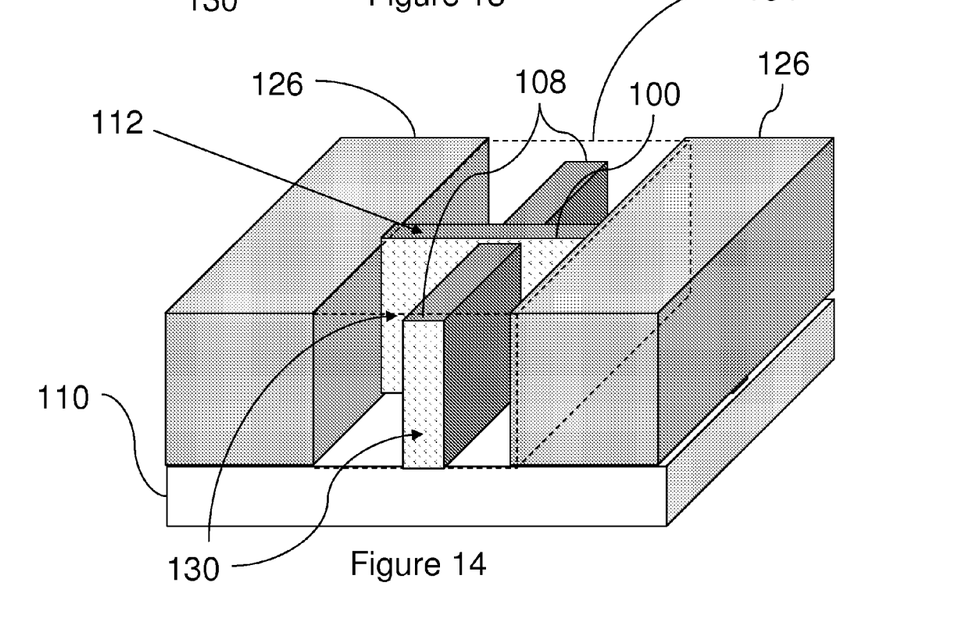
FIG. 14 is a schematic diagram of a partially completed FinFET.

In FIG. 12, a mask 126 is patterned to leave the channel region 112 and the channel extensions 108 exposed. Once again, this mask 126 can comprise any conventional mask such as a photoresist. In FIG. 13, the gate insulator 130 is formed on the exposed channel region 112 and channel extension 108. This gate insulator 130 can comprise a deposited insulator, such as a nitride, oxide, etc., or can comprise oxidized portions of the channel region 112 and the channel extension 108. A gate conductor 104, such as polysilicon, metal, alloy, or any other conductive material is then deposited over the exposed areas of the gate insulator 130. This process is commonly referred to as damascene processing, where openings are overfilled with a material and then the excess material is removed in a polishing process (e.g., chemical mechanical polishing (CMP), etc.) such that the material only remains within the openings. The mask material 126 is then removed using a selective removal process that does not affect the remaining structures to result in the structure shown in FIG. 15.

Figure 15:
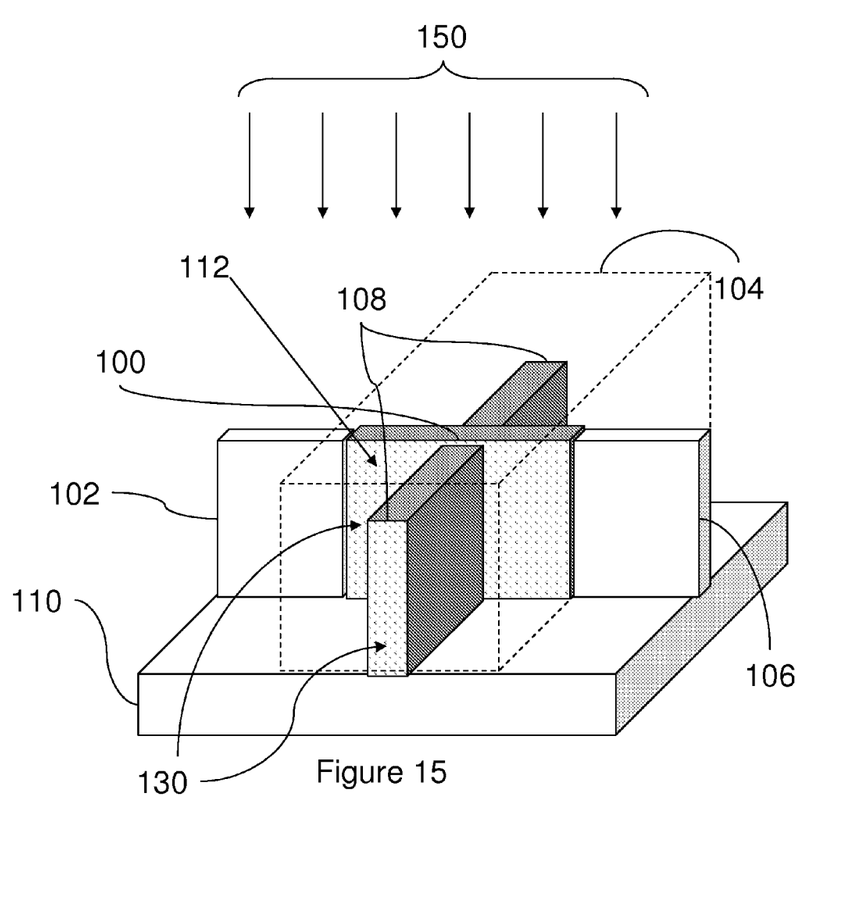
FIG. 15 is a schematic diagram of a partially completed FinFET.

Note, that the gate conductor 104 is shown as being transparent, with dashed lines to allow the remaining structures that exist below the gate conductor to be viewed easily. Also note that the outer portions of the fin 100 are not covered with the gate oxide 130. FIG. 15 also illustrates another impurity implant 150 similar to implant 124 that is utilized to make the end portions 102, 106 of the fin 100 conductive. This forms the source and drain regions 102, 106. This implant 150 does not change the conductivity of the channel region 112 or the channel extensions 108 because the gate conductor 104 protects the channel region 112 and the channel extensions 108 from receiving the impurity implant 150 during the impurity implant process. The structure will eventually be covered with an insulator and electrical contacts will be formed to the gate, source, and drain regions, and using conventional methodologies, well known to those ordinarily skilled in the art.

Figure 16:
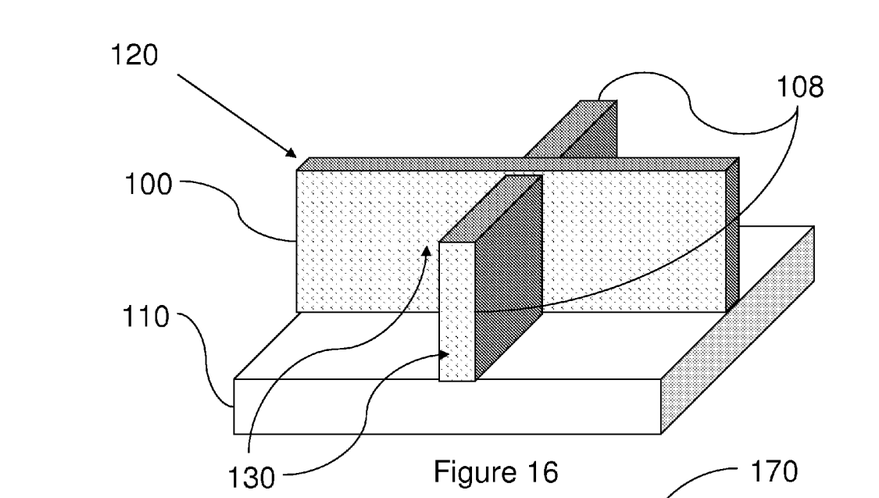
FIG. 16 is a schematic diagram of a partially completed FinFET.
Figure 17:
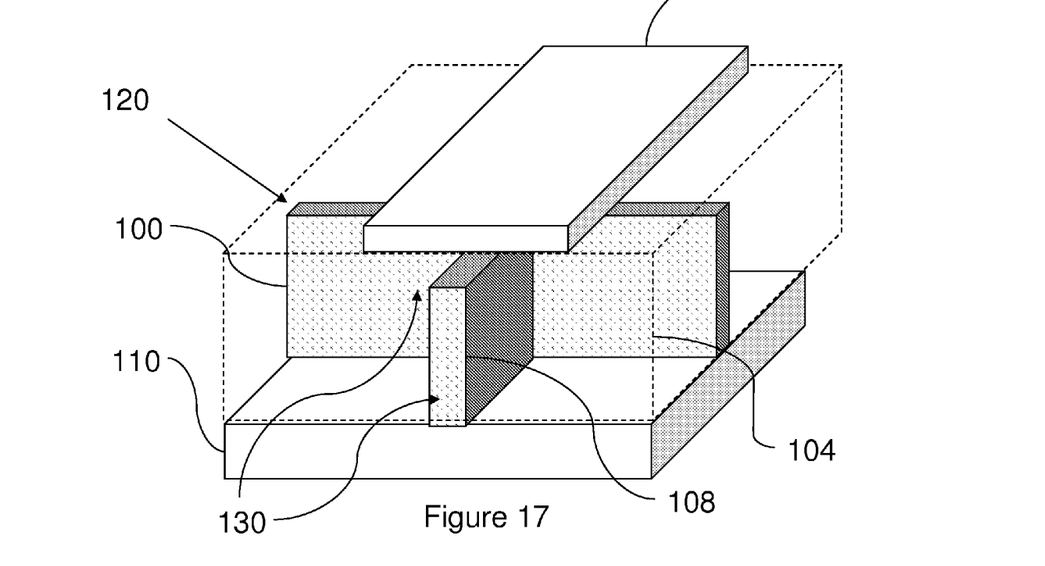
FIG. 17 is a schematic diagram of a partially completed FinFET.
Figure 18:
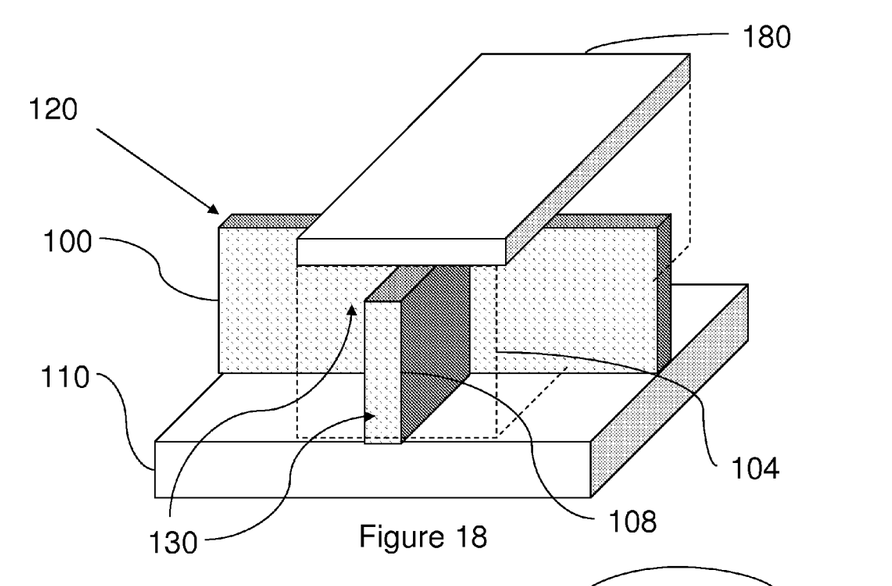
FIG. 18 is a schematic diagram of a partially completed FinFET.
Figure 19:
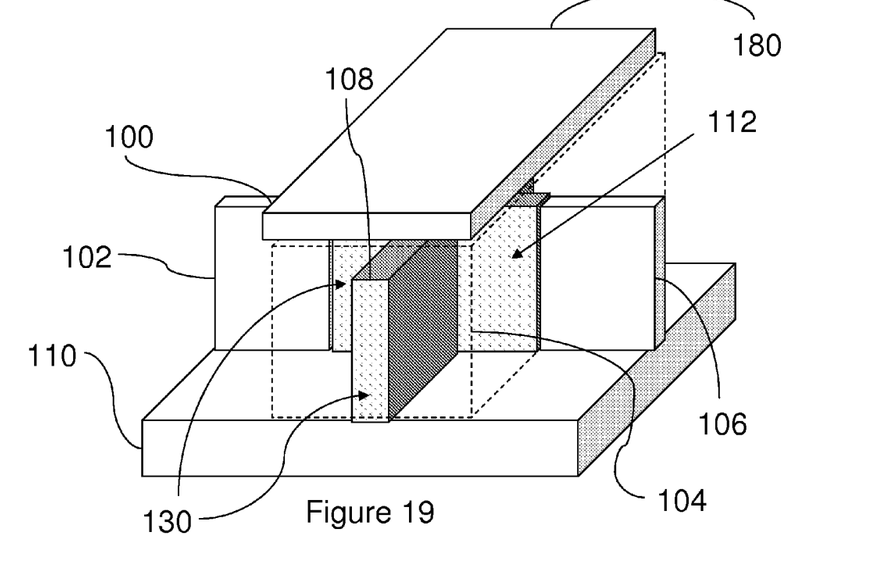
FIG. 19 is a schematic diagram of a partially completed FinFET.

As mentioned above, FIGS. 16-19 illustrate a different methodology for forming the same structure. FIG. 16 begins with the structure shown in FIG. 10 and forms the gate insulator 130 over the entire cross-shaped structure. Next, the gate conductor 104 is formed over the entire structure. A mask 180 is patterned to expose the regions where the source and drain will be positioned. This mask 180 is similar to the masks discussed above and comprises, for example, a photolithographic mask. In FIG. 18, the portions of the gate conductor 104 not protected by the mask 180 are removed in a selective material removal process, such as a directional etching process. Then, the gate insulator 130 is similarly removed from the end portions 102, 106 of the fin 100, again using a selective material removal process, such as etching, that leaves the remaining structures 100, 104 unaffected. The mask 180 is then removed and the processing shown in FIG. 15 is performed to complete the structure and form the source and drain regions 102, 106.

The channel extensions 108 can be approximately perpendicular to the fin 100. The process of forming the gate conductor 104 forms a linear conductor that intersects the fin 100, wherein the channel extensions 108 are patterned to run substantially parallel to the gate conductor 108. The patterning process also forms the channel extensions 108 and the fin 100 (channel) simultaneously as a unitary continuous structure. The channel extensions 108 and the fin 100 are patterned to form a cross-shaped structure. The channel extensions 108 can comprise fins, rectangles, bumps, irregularly shaped structures, etc.

Figure 20:
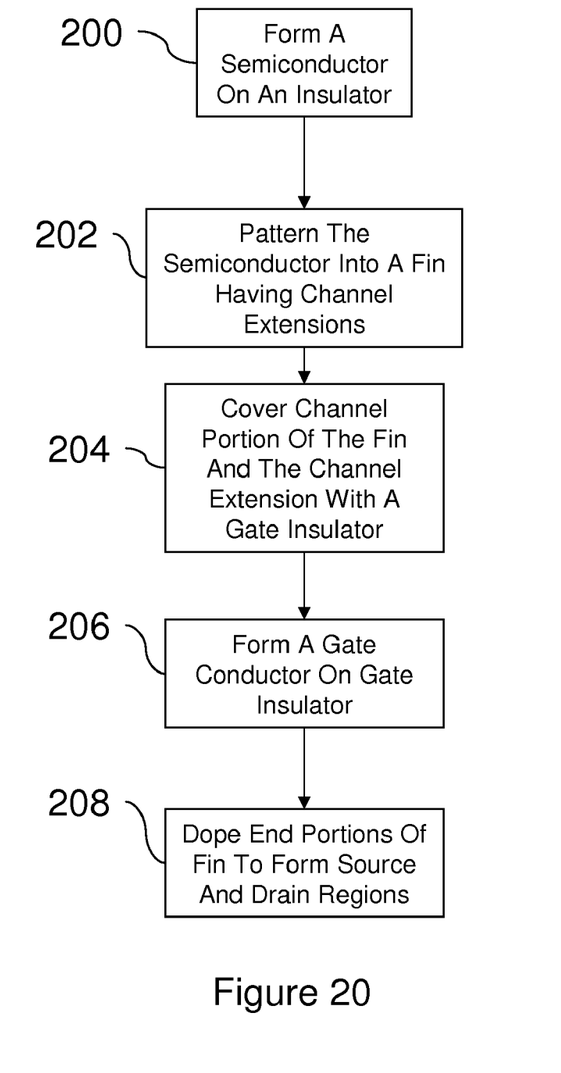
FIG. 20 is a flow diagram illustrating a preferred method of the invention.

FIG. 20 is a flowchart illustrating steps in the inventive processing. In item 200, the invention forms a semiconductor on an insulator and then, in item 202, patterns the semiconductor into a fin having channel extensions extending from sidewalls of a central channel portion of the fin. The channel portion of the fin and the channel extensions are then covered with a gate insulator in item 204. Next a gate conductor is formed on the gate insulator 206. Then, end portions of the fin are doped to form source and drain regions 208.

As mentioned above, as the surface areas of the channel regions become smaller and smaller, the circuit node capacitances can become too small, which can result in high susceptibility to circuit noise and radiation. In order to overcome this problem, the invention adds to the surface area of the channel region using channel extensions 108 to add capacitance (adds a capacitor) to enhance the circuit stability with a minimum impact on density.

While the invention has been described in terms of preferred embodiments, those skilled in the art will recognize that the invention can be practiced with modification within the spirit and scope of the appended claims.

What is claimed is:

1. A fin-type field effect transistor (FinFET) comprising:
 a fin having a center channel portion and end portions comprising source and drain regions;
 at least one channel extension extending from at least one side of said channel portion of said fin;
 a gate insulator over said channel portion and said channel extension; and
 a gate conductor over said gate insulator.

2. The FinFET in claim 1, wherein said channel extension is perpendicular to said fin.

3. The FinFET in claim 1, wherein said gate insulator covers said channel extension and insulates said channel extension from said gate conductor.

4. The FinFET in claim 1, wherein said gate conductor comprises a linear conductor that intersects said fin, wherein said channel extension runs parallel to said gate conductor.

5. The FinFET in claim 1, wherein said channel extension and said fin comprise a unitary continuous structure.

6. The FinFET in claim 1, wherein said channel extension comprises two similar extensions extending from said fin, and wherein said extensions and said fin form a cross-shaped structure.

7. The FinFET in claim 1, wherein said channel extension comprises one of a fin, a rectangle, a bump, and an irregularly shaped structure.

8. A fin-type field effect transistor (FinFET) comprising:
 a fin having a center channel portion, end portions comprising source and drain regions, and channel extensions extending from sidewalls of said channel portion of said fin;
 a gate insulator covering said channel portion and said channel extensions; and
 a gate conductor on said gate insulator.

9. The FinFET in claim 8, wherein said channel extensions increase capacitance of said channel portion of said fin.

10. The FinFET in claim 8, wherein said channel extensions are perpendicular to said fin.

11. The FinFET in claim 8, wherein said gate conductor comprises a linear conductor that intersects said fin, wherein said channel extensions run parallel to said gate conductor.

12. The FinFET in claim 8, wherein said channel extensions and said fin comprise a unitary continuous structure.

13. The FinFET in claim 8, wherein said channel extensions and said fin form a cross-shaped structure.

14. The FinFET in claim 8, wherein said channel extensions comprise one of fins, rectangles, bumps, and irregularly shaped structures.

15. A fin-type field effect transistor (FinFET) comprising:
 a fin having a center channel portion and end portions comprising source and drain regions;
 at least one channel extension extending from at least one side of said channel portion of said fin, wherein said channel extension is perpendicular to said fin;
 a gate insulator over said channel portion and said channel extension; and
 a gate conductor over said gate insulator and said channel extension.

16. The FinFET in claim 1, wherein said gate insulator covers said channel extension and insulates said channel extension from said gate conductor.

17. The FinFET in claim 1, wherein said gate conductor comprises a linear conductor that intersects said fin, wherein said channel extension runs parallel to said gate conductor.

18. The FinFET in claim 1, wherein said channel extension and said fin comprise a unitary continuous structure.

19. The FinFET in claim 1, wherein said channel extension comprises two similar extensions extending from said fin, and wherein said extensions and said fin form a cross-shaped structure.

20. The FinFET in claim 1, wherein said channel extension comprises one of a fin, a rectangle, a bump, and an irregularly shaped structure.

* * * * *